US008648672B2

(12) United States Patent
Onzuka

(10) Patent No.: US 8,648,672 B2
(45) Date of Patent: Feb. 11, 2014

(54) FILTER, PORTABLE TERMINAL AND ELECTRONIC COMPONENT

(75) Inventor: Tatsunori Onzuka, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 544 days.

(21) Appl. No.: 12/735,611

(22) PCT Filed: Feb. 5, 2009

(86) PCT No.: PCT/JP2009/052350
§ 371 (c)(1),
(2), (4) Date: Nov. 16, 2010

(87) PCT Pub. No.: WO2009/099248
PCT Pub. Date: Aug. 13, 2009

(65) Prior Publication Data
US 2011/0102107 A1     May 5, 2011

(30) Foreign Application Priority Data

Feb. 5, 2008  (JP) ................................. 2008-025630
Jun. 23, 2008  (JP) ................................. 2008-163633

(51) Int. Cl.
*H03H 9/46* (2006.01)
*H03H 9/54* (2006.01)
*H03H 9/64* (2006.01)
*H03H 7/01* (2006.01)

(52) U.S. Cl.
USPC ............ 333/186; 333/189; 333/193; 333/176

(58) Field of Classification Search
USPC .................. 333/186, 189, 193, 195, 175, 176; 310/313 B, 313 D
See application file for complete search history.

(56) References Cited

U.S. PATENT DOCUMENTS

| 1,644,004 A | 10/1927 | Zobel ............................ 333/168 |
| 5,151,672 A | 9/1992 | Noto et al. ..................... 333/189 |

(Continued)

FOREIGN PATENT DOCUMENTS

| CN | 101084623 | 12/2007 |
| JP | 3-185908 | 8/1991 |

(Continued)

OTHER PUBLICATIONS

English language machine translation of JP 6-350391, published on Dec. 12, 1994, four pages.*

(Continued)

*Primary Examiner* — Barbara Summons
(74) *Attorney, Agent, or Firm* — Jordan and Hamburg LLP

(57) ABSTRACT

An object is to obtain a steep and large attenuation amount in attenuation bands close to each other out of a band of a TV wave and to provide a filter in which the use number of inductors is reduced thereby to be able to contribute to downsizing of a device. Elastic wave resonators of a plurality of parallel arms for each forming plurality of attenuation band are connected to the same electric potential point in a signal path without aid of an inductor. Otherwise, a series circuit of a plurality of element parts generating series resonance is connected in a signal path as a parallel arm. Therefore, a large attenuation amount can be obtained in each of the plural attenuation bands, but a region equivalent to what is called a zero point exists between adjacent poles. However, there can be obtained a characteristic in which steep attenuations occur in both sides of the zero point even if the zero point exists. Sets of elastic wave resonators (sets of resonators) connected to the same potential points or parallel arms constituted by the series circuits are connected in a signal path in a plurality of stages, and an inductor for inverting a phase intervenes between the stages.

12 Claims, 24 Drawing Sheets

(56) References Cited

U.S. PATENT DOCUMENTS

| | | | |
|---|---|---|---|
| 6,404,302 B1 | 6/2002 | Satoh et al. | 333/193 |
| 6,844,795 B2 | 1/2005 | Inose | 333/193 |
| 6,879,224 B2 | 4/2005 | Frank | 333/189 |
| 7,777,597 B2 | 8/2010 | Beaudin et al. | 333/189 |
| 8,004,371 B2 | 8/2011 | Beaudin et al. | 333/133 |
| 8,207,799 B2 | 6/2012 | Beaudin et al. | 333/117 |
| 2003/0227358 A1 | 12/2003 | Inose | 333/193 |
| 2004/0051601 A1 | 3/2004 | Frank | 333/187 |
| 2004/0119561 A1 | 6/2004 | Omote | 333/133 |
| 2004/0130411 A1* | 7/2004 | Beaudin et al. | 333/133 |
| 2007/0159274 A1 | 7/2007 | Onzuka | 333/193 |
| 2008/0117001 A1* | 5/2008 | Wada | 333/193 |
| 2008/0129411 A1 | 6/2008 | Beaudin et al. | 333/133 |
| 2008/0169886 A1* | 7/2008 | Kuroda | 333/193 |
| 2009/0128260 A1* | 5/2009 | Block et al. | 333/187 |
| 2010/0308911 A1 | 12/2010 | Beaudin et al. | 333/185 |
| 2011/0248795 A1 | 10/2011 | Beaudin et al. | 333/133 |
| 2012/0235877 A1 | 9/2012 | Beaudin et al. | 343/853 |

FOREIGN PATENT DOCUMENTS

| | | | |
|---|---|---|---|
| JP | 6-350391 | | 12/1994 |
| JP | 2004-007737 | | 1/2004 |
| JP | 2004-015397 | | 1/2004 |
| JP | 2004-104799 | | 4/2004 |
| JP | 2006-325032 | | 11/2006 |
| JP | 2007/202136 | | 8/2007 |
| JP | 2010-62816 | * | 3/2010 |
| WO | WO-2006/045176 | | 5/2006 |

OTHER PUBLICATIONS

T. Bauer et al.; "SAW Band Rejection Filters for Mobile Digital Television"; 2008 IEEE Ultrasonics Symposium, Nov. 2-5, 2008, pp. 288-291.*

* cited by examiner (a)

(b)

FILTER, PORTABLE TERMINAL AND ELECTRONIC COMPONENT

TECHNICAL FIELD

The present invention relates to a filter such as an SAW (surface acoustic wave) filter for example, to a portable terminal having a digital terrestrial TV reception device for example in which the filter is used, and to an electronic component in which the filter is used.

BACKGROUND ART

Digital terrestrial broadcast in Japan began in 2003, and a service of digital terrestrial broadcast began in Europe and other districts from 2000. Meanwhile, as portable terminals become popular, there have been provided various high value added services such as a mail function in comparison with a telephone function of a conventional portable terminal. In such a trend, portable terminal manufacturers in the world consider to bring in a service of receiving digital terrestrial broadcast by giving a portable terminal a reception function of digital terrestrial TV broadcast in addition to a conventional portable telephone function thereby to make a portable terminal with a digital terrestrial TV receiver.

A digital terrestrial TV tuner module for a portable terminal as above, being aimed for a portable terminal, is required to be less power-consuming, smaller and shorter, in addition to coping with a problem in terms of a characteristic of a tuner in itself such as reception sensitivity, and is further required to prevent a transmission wave from blocking a reception wave.

FIG. 31 shows a constitution diagram of a transmission/reception section of a portable terminal having a digital terrestrial TV receiver. In a portable terminal capable of receiving digital TV broadcast, due to a difference between frequency bands of audio (data) communication and TV broadcast, two antennas of an antenna 1 for receiving digital TV broadcast and an antenna 2 for transmitting/receiving an audio (and data) communication signal are closely disposed. Here, usually, a digital TV broadcast wave is a weak radio wave (−90 dBm), and thus reception sensitivity of a TV tuner module 10 is designed to be quite high. On the other hand, a transmission wave of an audio transmission section 20 transmitting audio (and data) as the portable terminal makes the antenna 2 emit a very strong radio wave (about +30 dBm). Therefore, the transmission wave of audio (and data) communication reaches the TV broadcast tuner module 10 via the antenna 1 and interferes reception of TV broadcast. Thus, it is said that a D/U ratio (Desired/Undesired Ratio: power ratio between desired wave and ghost wave) of 120 dB is required for a portable terminal having a digital terrestrial TV receiver.

Incidentally, a reception band of digital TV broadcast in Japan is 470 MHz to 770 MHz and a transmission band of audio communication exists closely thereto in a higher frequency side than the reception band. The reception bands are different by communication common carriers and at present there exist transmission bands of 824 to 830 MHz, 898 to 925 MHz, and 1940 to 1960 MHz. FIG. 32 is a characteristic chart showing a pass band and attenuation bands each corresponding to the reception band of digital TV broadcast and transmission bands of audio communication used by the communication common carriers.

As already described above, the antennas are closely disposed and in a case that bands of transmission/reception waves are close to each other, there occurs a problem that a transmission wave of audio or data communication reaches the digital TV broadcast reception antenna via the antenna thereby giving interference to a weak reception wave of TV broadcast. In order to avoid this interference, it is required to provide a filter having a steep attenuation amount at a root of the reception antenna for digital TV broadcast.

FIG. 33 shows a constitution example of a reception system of a digital terrestrial TV tuner module which satisfies the above-described requirement. A BEF circuit (band elimination filter circuit) 11 has a steep suppression (−50 to −60 dB) characteristic for a transmission wave frequency band discharged from a transmission/reception antenna (not shown) of a cellular phone, and takes in a digital terrestrial TV wave received by an antenna 1 at a low loss. An LC filter 12, constituted by a chip coil and a chip inductor, suppresses (−20 to −40 dB) the transmission wave frequency band. A balun circuit 13, while suppressing (−10 to −20 dB) the transmission wave frequency band, performs balance-unbalance conversion on a TV broadcast wave. An IC circuit 14 converts a TV signal to become a modulated wave into a base band.

A characteristic required for a BEF circuit is having a low loss in a reception band of digital TV broadcast (small attenuation amount), and having a steep attenuation and a large attenuation amount in a transmission band of audio or data broadcast. As a BEF circuit, there is generally a passive circuit using a coil or a capacitor, a dielectric filter utilizing a high Q value of a dielectric, and a laminated chip component such as LTCC and HTCC in which the passive circuit is disposed on a pattern and further sintered. However, a module mounted in a portable terminal is restricted in terms of a mounting area and a space, and the above constitution has its limit. Further, since the reception band of digital TV broadcast and the transmission band of audio or data are quite close to each other, a steep attenuation characteristic is necessary. In a conventional filter design theory, in order to is raise steepness, resonance circuits being constituents of a filter are connected in two stages or more, so that a loss in a pass band becomes quite large.

Then, as a filter enabling small power consumption, miniaturization and shortness, there is an SAW (surface acoustic wave) filter. However, it is difficult to obtain a broad pass band and a large attenuation amount by constituting the SAW filter by an SAW resonator alone. On the other hand, Patent Document 1 describes a constitution in which SAW resonators being parallel arms are connected in a plurality of stages via an inductor provided in a transmission path (signal path), and if this method is adopted, it is possible to obtain a pass band with a small attenuation amount and an attenuation band which is close to this pass band and in which a large attenuation amount can be obtained. FIG. 34 shows an SAW filter constituted by connecting SAW resonators 31 being seven parallel arms and inductors for phase inversion (for displacing a phase by 90 degrees), with a reference numeral 33 indicating an input port and a reference numeral 34 indicating an output port.

When an attenuation band from 824 to 830 MHz is called a first attenuation band and an attenuation band from 898 to 925 MHz is called a second attenuation band, SAW resonators resonating in parallel in the first attenuation band are allotted to three of seven SAW resonators 31 and SAW resonators resonating in parallel in the second attenuation band are allotted to the remaining four SAW resonators. FIG. 35 shows a filter characteristic of this circuit, and it can be known that an excellent filter characteristic fulfilling the above requirement can be obtained. In this SAW filter, a still large attenuation amount can be secured by increasing the number of connection stages of the SAW resonators 31.

Incidentally, since the number of inductors increases as the number of connection stages of the SAW resonators, a size of a device becomes large due to the following reason. When the inductor is to be created according to a wiring pattern, it is necessary to bend a large pattern and to make a film thickness large, making a conductor loss large and lowering a Q value. Thus, it is practical to use an external coil. FIG. 36 is a schematic perspective view of an SAW filter in a case that an external coil is used, and a reference numeral 35 indicates a wiring board, a reference numeral 36 indicates an SAW device in which SAW resonators are formed, and a reference numeral 37 indicates the external coil. As can be known from this diagram, when the mount number of the external coils is large the size of the device becomes large, which is a large cause for hampering miniaturization of the device.

Since a portable terminal is required to be still smaller due to increased variation of functions and the like, a technology capable of further downsizing an SAW filter device is requested.

Patent Document 2 describes a technology to connect a plurality of SAW resonators having different resonance frequencies from each other to the same electric potential point and to combine these plural resonance frequencies thereby to constitute one band-pass filter, but does not describe a filter to cope with steep attenuation bands close to each other.

PRIOR ART DOCUMENT

Patent Document 1: Japanese Patent Application Laid-open No. 2004-104799
Patent Document 2: Japanese Patent Application Laid-open No. 2004-15397

SUMMARY OF THE INVENTION

An object of the present invention is to provide a filter which has a characteristic of a low loss in a required pass band and which obtains a steep and large attenuation amount in a plurality of attenuation bands other than the pass band. Another object of the present invention is to provide a filter in which the number of inductors to be used for phase inversion is reduced thereby to be able to contribute to downsizing. Further, still another object of the present invention is to provide a portable terminal and an electronic component having the above-described filter.

A filter according to the present invention for forming a plurality of attenuation bands in a higher band side or a lower band side than a pass band includes:

element parts generating series resonance at frequencies each corresponding to the plurality of attenuation bands, the element parts connected to the same electric potential point in a signal path as a plurality of parallel arms, in order to form the respective plurality of attenuation bands;

sets of element parts constituted by a plurality of the element parts, the sets of element parts connected to a signal path in a plurality of stages;

and an inductor for phase inversion provided in the signal path between the sets of element parts adjacent to each other.

A filter according to another invention for forming a plurality of attenuation bands in a higher band side or a lower band side than a pass band includes:

a plurality of element parts generating series resonance at frequencies each corresponding to the plurality of attenuation bands, the plurality of element parts connected to each other in series and a series circuit connected to a signal path as a parallel arm, in order to form the respective plurality of attenuation bands;

sets of element parts being the series circuit constituted by the plurality of element parts, the sets of element parts connected to the signal path in a plurality of stages;

and an inductor for phase inversion provided in the signal path between the sets of element parts adjacent to each other.

As a concrete example of the element part generating series resonance, an elastic wave resonator, a surface acoustic wave resonator, a crystal resonator, a piezoelectric thin film resonator, an MEMS (Micro Electro Mechanical Systems) resonator, a dielectric, a resonance circuit constituted by a coil and a capacitor, and the like can be cited. As the piezoelectric thin film resonator, an FBAR (Film Bulk Acoustic Resonator) or an SMR (Solid Mounted Resonator) for example can be cited.

As a modification example of the present invention, there can be cited a constitution wherein the number of connection stages of the sets of element parts is larger than the number of the attenuation bands by one or more, wherein element parts each generating series resonance are connected in parallel to the inductors of the number equivalent to the number of the attenuation bands among the inductors connected between the respective stages, thereby constituting parallel circuits, and wherein parallel resonance frequencies of the plurality of parallel circuits are set to be frequencies each corresponding to the plurality of attenuation bands. In the filter of the present invention, the pass band is a reception band of digital terrestrial TV broadcast and the attenuation band is a transmission band of audio and/or data as a portable terminal, for example.

A portable terminal according to the present invention includes: an antenna and a reception section for receiving a radio wave for digital terrestrial TV broadcast and an antenna for transmitting/receiving audio and/or data as the portable terminal, wherein the filter of the present invention is provided in the reception section. An electronic component of the present invention includes the filter of the present invention described above.

In the present invention, element parts generating series resonance being a plurality of parallel arms for forming a respective plurality of attenuation bands are connected to the same electric potential point in a signal path without aid of an inductor. Therefore, a large attenuation amount can be obtained in each of the plural attenuation bands, but a region equivalent to a zero point exists between adjacent poles (points of the highest attenuation). However, the present invention is objected to obtain a transmission characteristic to be able to cope with a plurality of attenuation bands for which large attenuation is required respectively, the object can be attained when the characteristic of steep attenuation occurring in both sides of the zero point is obtained even if the zero point exists.

As described above, sets of element parts connected to the same electric potential point are connected in a signal path in a plurality of stages and an inductor for inverting a phase intervene between the respective stages so that no zero point exists in the respective attenuation bands, and by connecting the sets of element parts in plural stages as above, a larger attenuation amount is secured, enabling to cope with the required transmission characteristic. As a result, a characteristic of a low loss is had and a large attenuation amount can be obtained in a plurality of attenuation bands outside a pass band, and further there is an effect that the use number of the inductors for phase inversion can be reduced thereby contributing to miniaturization of a device. Therefore, the filter of the present invention is suitable for a portable terminal for example, and quite proper for a case that a pass band is a reception band of digital terrestrial TV broadcast and an attenuation band is a transmission band of audio and/or data as a portable terminal, and suitable for preventing a transmission wave in a TV tuner of a portable terminal with a digital terrestrial TV receiver from giving interference to a reception wave of digital terrestrial TV broadcast.

BEST MODE FOR CARRYING OUT THE INVENTION

First Embodiment

Figure 1:
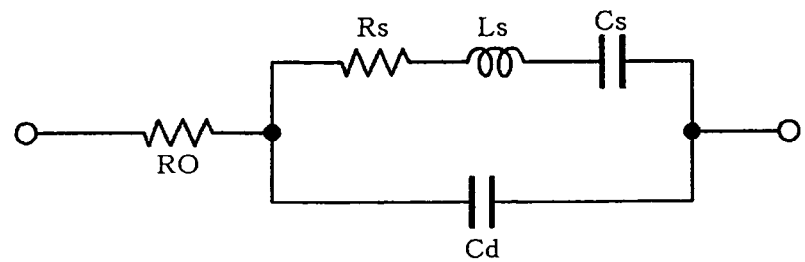
FIG. 1 are a circuit diagram showing an equivalent circuit of an SAW resonator and a characteristic chart showing a frequency characteristic of an admittance.
Figure 1:
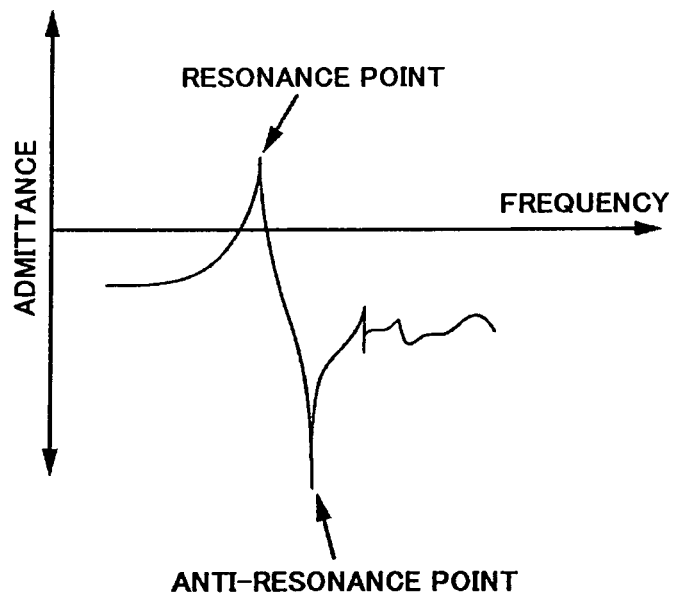
Figure 2:
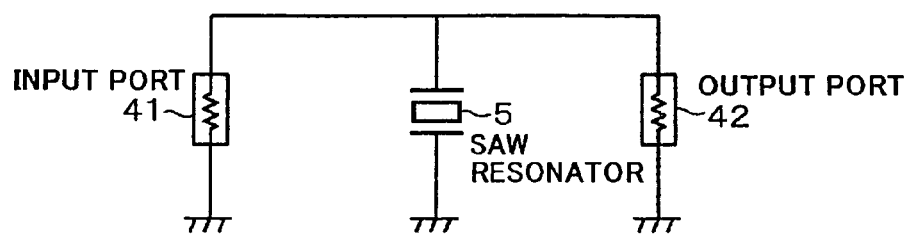
FIG. 2 is a circuit diagram showing an SAW filter using one SAW resonator.

Before describing embodiments of the present invention, a background leading to a constitution of the present invention, a reason that a transmission characteristic responding to the above-described request can be obtained, and the like will be stated. FIG. 1(a) shows an equivalent circuit of an SAW resonator being an elastic wave resonator, while FIG. 1(b) shows an admittance characteristic for a frequency of the SAW resonator. A reference symbol Rs indicates a series resistance (active resistance), a reference symbol Ls indicates a series inductance (active inductance), a reference symbol Cs indicates a series capacitance (active capacitance), a reference symbol Cd indicates an electrode capacitance (control capacitance), and a reference symbol RO indicates an external resistance. Since the SAW resonator has such an admittance characteristic, when a filter is constituted as shown in FIG. 2 by providing an SAW resonator 5 as a parallel arm between an input port 41 and an output port 42 whose terminal impedances are 50Ω respectively, a transmission characteristic shown in FIG. 3 can be obtained.

Figure 3:
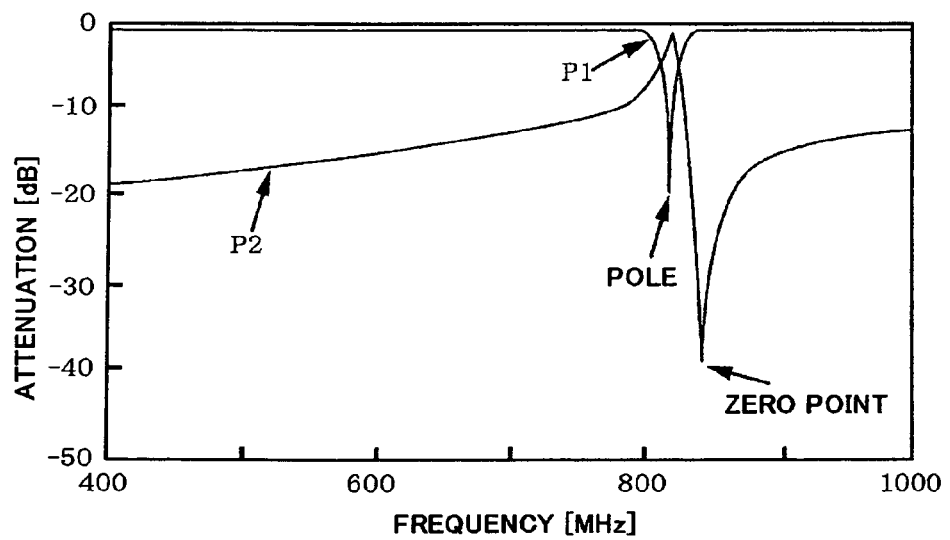
FIG. 3 is a characteristic chart showing a transmission characteristic of the SAW filter of FIG. 2.
Figure 4:
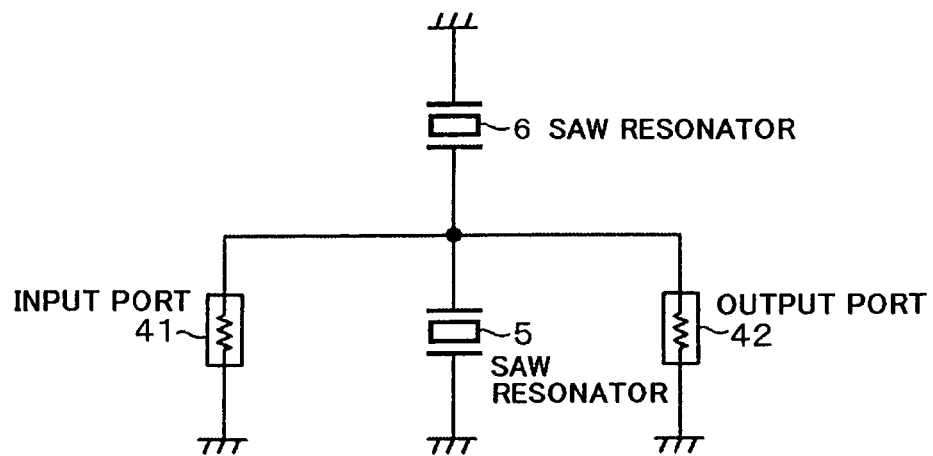
FIG. 4 is a circuit diagram showing an example of an SAW filter constituted by connecting two SAW resonators to the same electric potential point.
Figure 5:
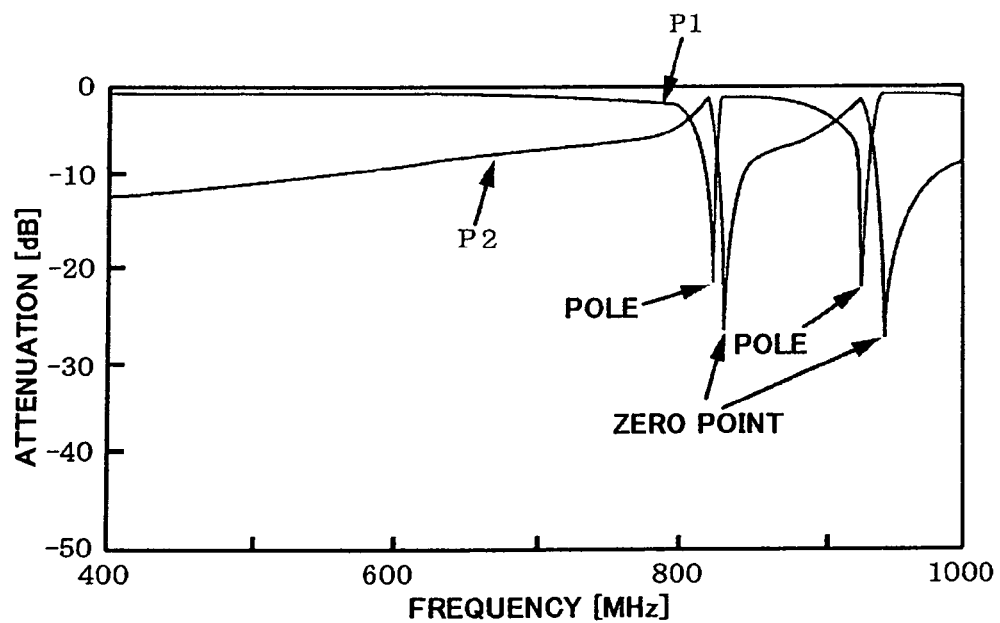
FIG. 5 is a characteristic chart showing a transmission characteristic of the SAW filter of FIG. 4.

In FIG. 3, a reference symbol P1 indicates a pass characteristic and a reference symbol P2 indicates a reflection characteristic, and the pass characteristic drops most to form a pole at a frequency where the SAW resonator 5 short-circuits, that is, at a series resonance frequency (resonance point) while the reflection characteristic drops most to form a zero point at a frequency where the SAW resonator 5 becomes open, that is, at a parallel resonance frequency (anti-resonance point). FIG. 4 shows an SAW filter constituted by connecting two SAW resonators 5, 6 to the same electric potential point in a signal path as parallel arms, to the SAW resonators 5, 6 resonance points different from each other being set in order to respectively obtain steep attenuation amounts in two attenuation bands close to each other. FIG. 5 shows a transmission characteristic in the SAW filter of FIG. 4 and it can be known that in a pass characteristic poles exist respectively in two aimed attenuation bands and that a zero point of a reflection characteristic exists between the two poles. In other words, in this transmission characteristic a region of quite low loss exists between two attenuation bands.

Figure 6:
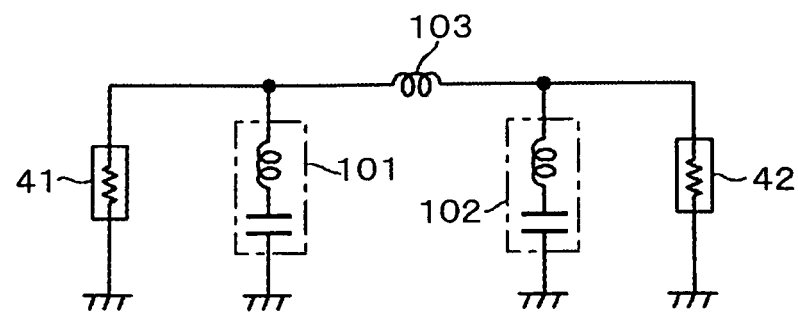
FIG. 6 is a circuit diagram showing a filter constituted by connecting series resonance circuits in two stages via an inductor.
Figure 7:
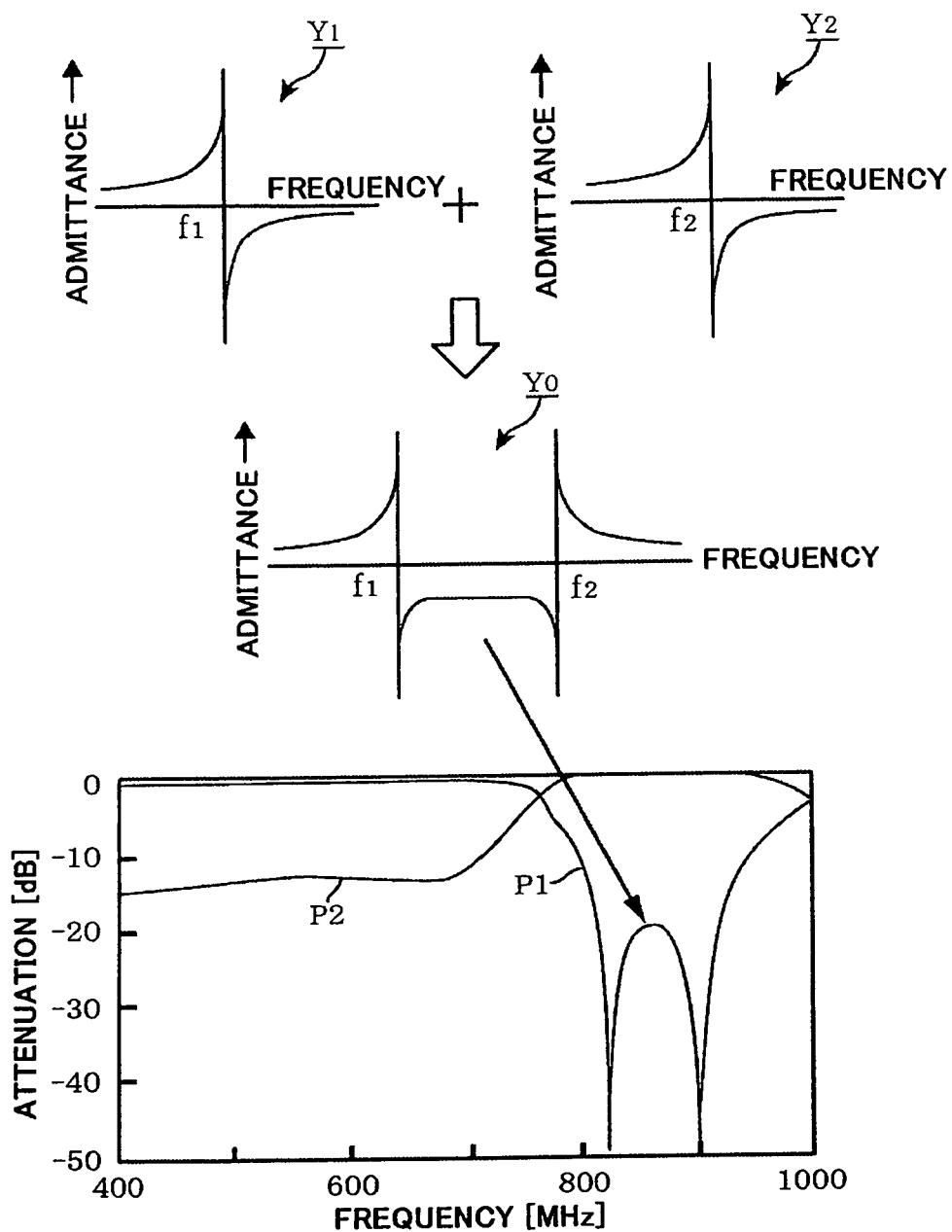
FIG. 7 are explanation charts correspondingly showing frequency characteristics and transmission characteristics of admittances in the circuit of FIG. 6.

A reason for the above will be considered by using a series resonance circuit instead of an SAW resonator. FIG. 6 shows series resonance circuits 101, 102 constituting parallel arms, and an inductor 103 for inverting a phase is provided in an intervening manner in a signal path between the series resonance circuits 101, 102. Resonance frequencies of the series resonance circuits 101, 102 are adjusted to be f1 (824 MHz) and f2 (898 MHz) respectively. In such a case, admittance characteristics for the frequencies of respective series resonance circuits 101 (102) are each indicated as Y1, Y2 as shown in upper charts of FIG. 7. Since the inductor 103 intervenes, the admittance characteristic Y2 is inverted and thus an admittance characteristic of the whole filter circuit is indicated as Y0. Therefore, as shown in a lower chart of FIG. 7, the transmission characteristic is attenuated between the frequencies f1 and f2, and a band blocking filter from f1 to f2 is formed.

Figure 8:
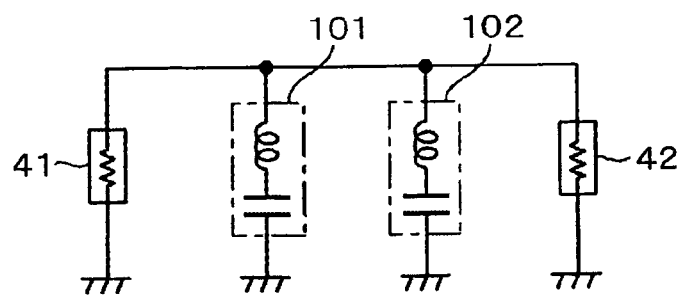
FIG. 8 is a circuit diagram showing a filter constituted by connecting series resonance circuits to the same electric potential point in two stages.
Figure 9:
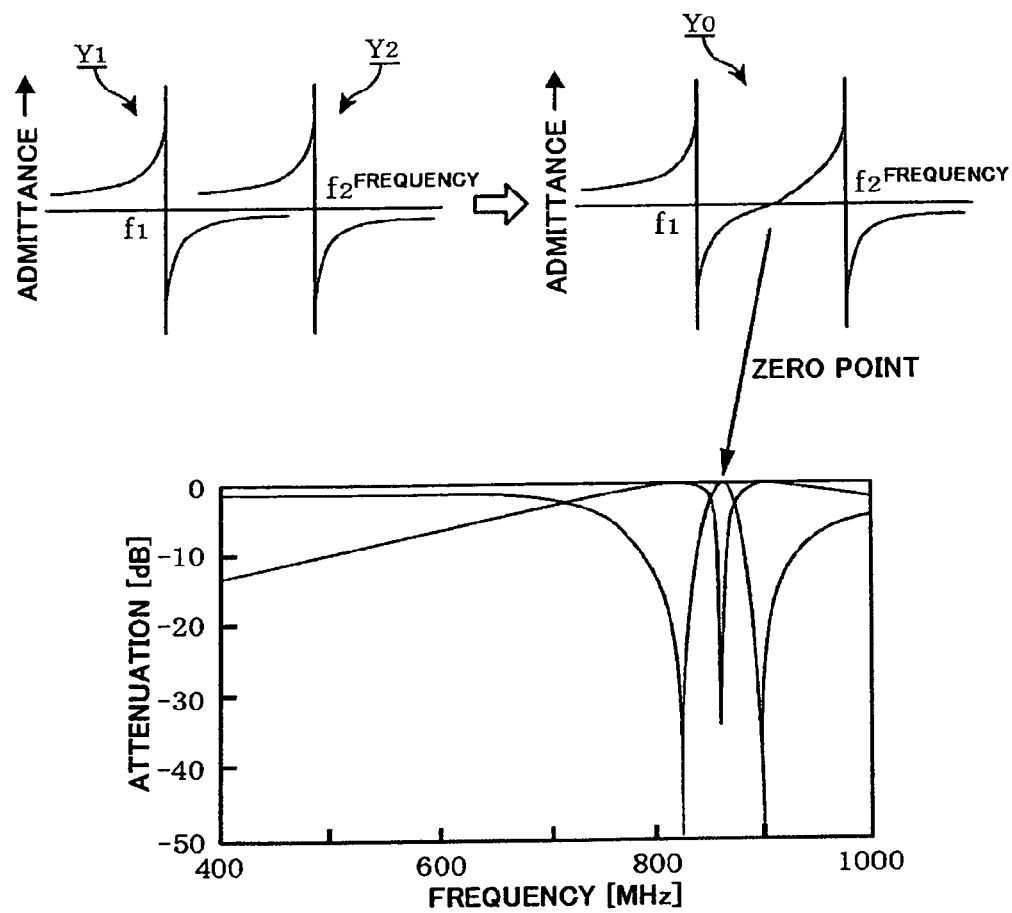
FIG. 9 are explanation charts correspondingly showing frequency characteristics and transmission characteristics of admittances in the circuit of FIG. 8.

In contrast, when series resonance circuits 101, 102 whose resonance frequencies are adjusted similarly are connected to the same electric potential point of a signal path as parallel arms as shown in FIG. 8, admittance characteristics Y1, Y2 for the frequencies of the respective series resonance circuits 101, 102 are indicated as shown in an upper left side chart of FIG. 9, and an admittance characteristic Y0 in the entire filter circuit is indicated as shown in a right side chart of FIG. 9. In other words, since an inductor 103 does not exist, the admittance characteristic Y2 is not inverted, and thus a frequency (zero point) at which an admittance becomes zero exists between frequencies f1, f2, a transmittance characteristic being indicated as shown in a lower side chart of FIG. 9. In other words, a pass characteristic steeply drops at the frequencies f1, f2 but a zero point exists therebetween, which is improper for a band blocking filter.

Figure 32:
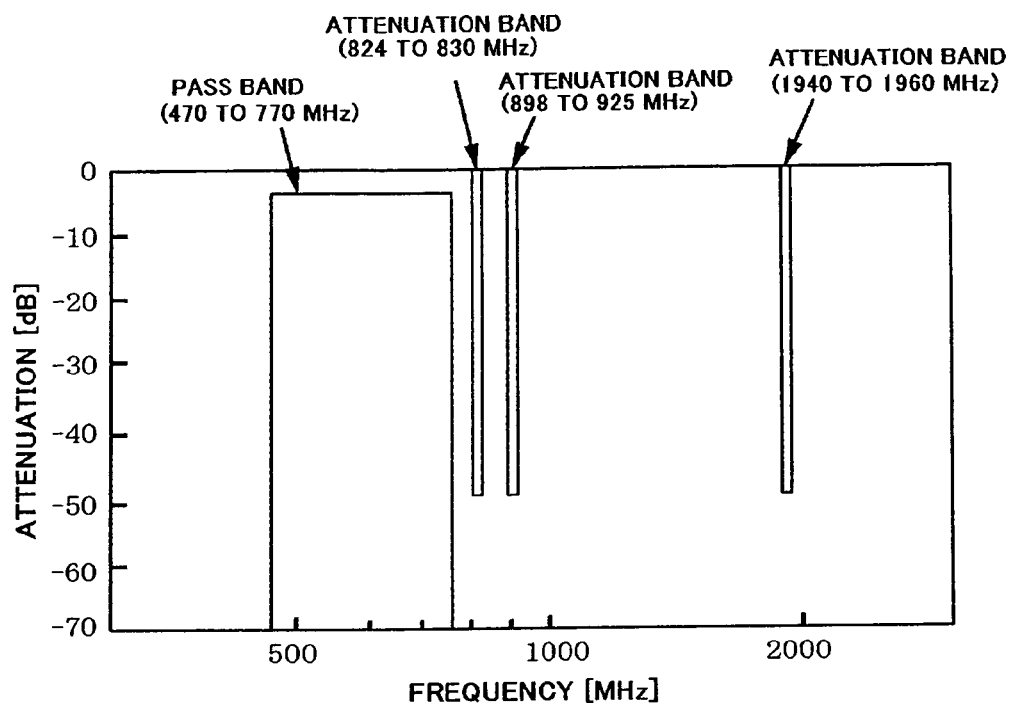
FIG. 32 is a characteristic chart showing a pass band and an attenuation band required for a BEF circuit of a digital terrestrial TV tuner.
Figure 33:
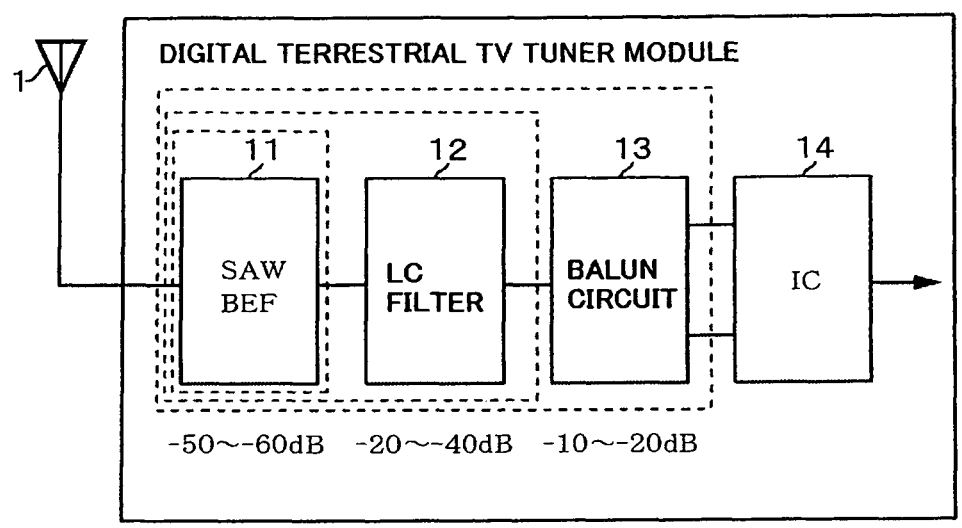
FIG. 33 is a constitution diagram showing a reception system of a digital terrestrial TV tuner module.
Figure 34:
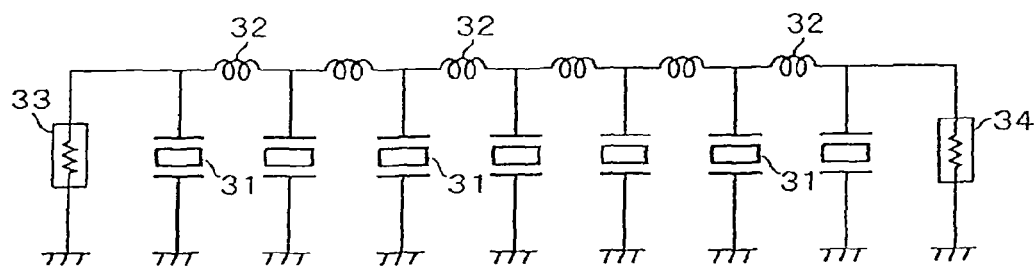
FIG. 34 is a circuit diagram showing an SAW filter constituted by a conventional method.
Figure 35:
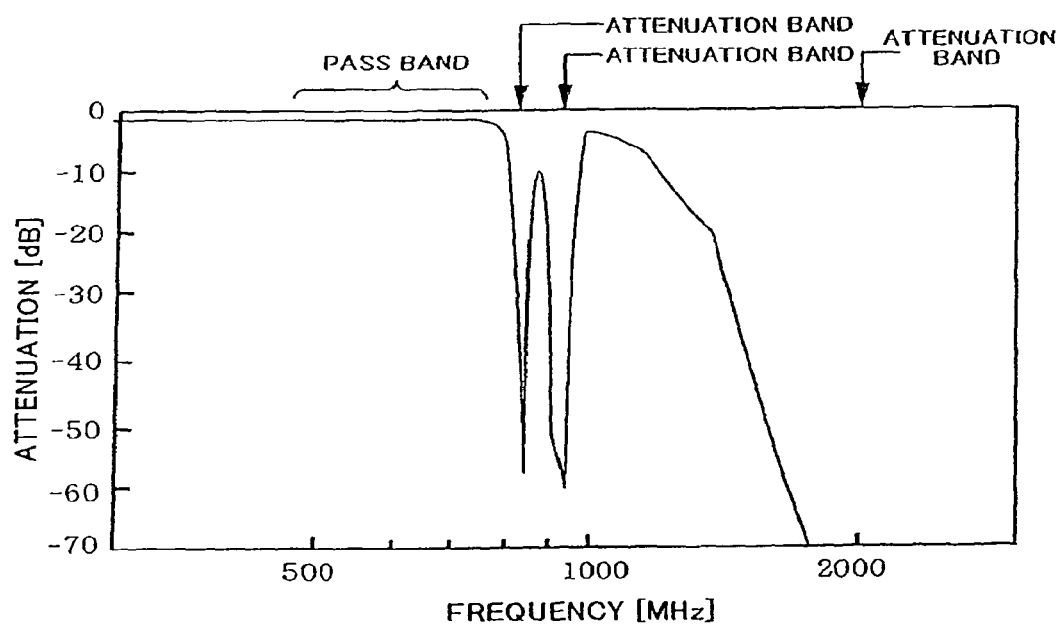
FIG. 35 shows a transmission characteristic obtained by the circuit of FIG. 34.
Figure 36:
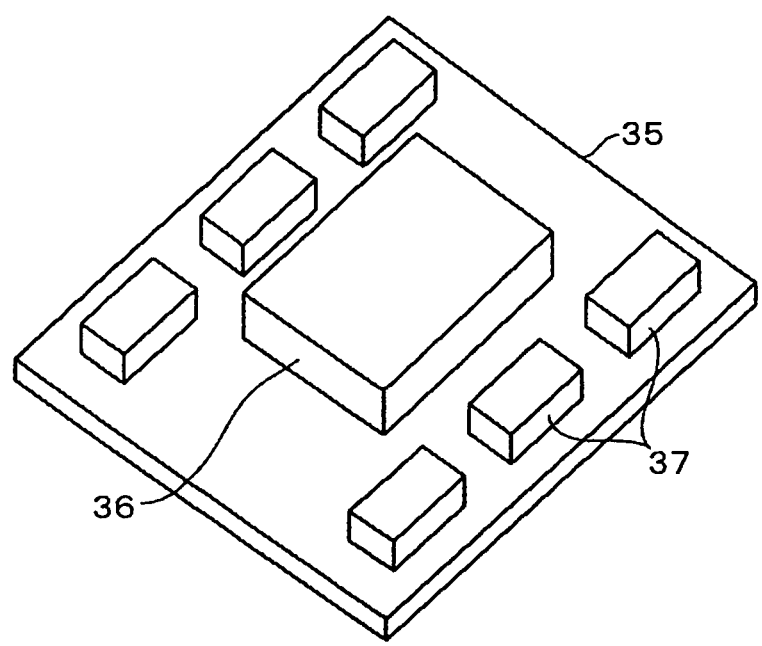
FIG. 36 is a perspective view showing an example of an overview of an SAW filter.

On the other hand, as shown in FIG. 32 described above, the transmission characteristic of FIG. 9 is rather advantageous for a filter whose pass band is a reception band of digital TV broadcast and whose attenuation band is a transmission band of audio communication used by a communication common carrier. In other words, as a filter coping with a plurality of attenuation bands each being a narrow band, by connecting the plural SAW resonators corresponding to the respective attenuation bands to the same potential point in a signal path as parallel arms, an aimed transmission characteristic can be obtained and the use number of inductors can be reduced. For example, in a case that large attenuation amounts are required in two narrow attenuation bands provided in a higher band side of a pass band, two SAW resonators whose series resonance frequencies are each adjusted within the above-described two attenuation bands are used.

Figure 10:
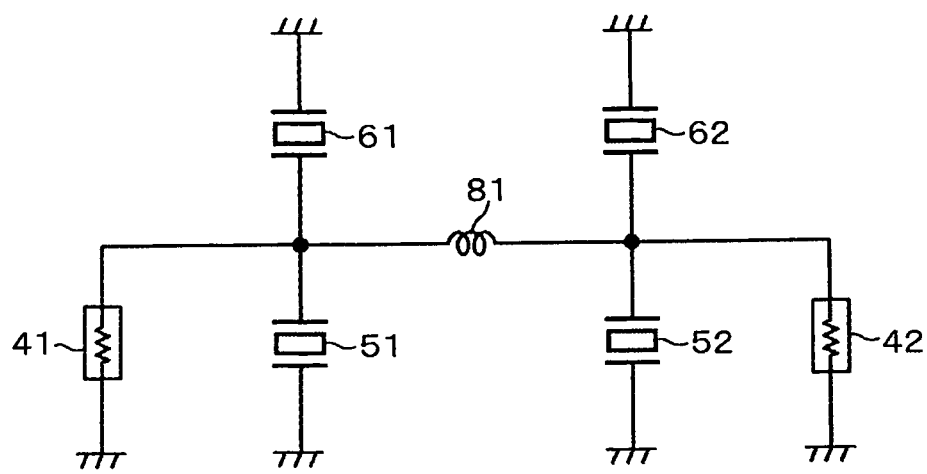
FIG. 10 is a circuit diagram showing an SAW filter being an embodiment of the present invention.

However, in a case that only one set of two SAW resonators 5, 6 exists as shown in FIG. 4, a sufficient attenuation amount cannot be secured in an attenuation band. Thus, in the present invention, as shown in FIG. 10, sets of two SAW resonators connected to the same electric potential point in a signal path are connected in two stages via an inductor 81 constituted by a coil for example. In FIG. 10, both of SAW resonators 51, 52 are for securing a large attenuation amount in a first attenuation band (attenuation band of 824 to 830 MHz), while both of SAW resonators 61, 62 are for securing a large attenuation amount in a second attenuation band (attenuation band of 898 to 925 MHz). Therefore, though each series resonance frequency of the SAW resonators 51, 52 is adjusted to be within the first attenuation band, the frequency can slightly depart from the first attenuation band. Further, though each series resonance frequency of the SAW resonators 61, 62 is adjusted to be within the second attenuation band, the frequency can slightly depart from the second attenuation band. In other words, each series resonance frequency of the SAW resonators 51, 52 is set to be a frequency corresponding to a frequency of the first attenuation band and each series resonance frequency of the SAW resonators 61, 62 is set to be a frequency corresponding to a frequency of the second attenuation band.

Further, the resonance frequencies of the SAW resonators 51, 52 adjusted to be within the first attenuation band are different from each other, and the resonance frequencies of the SAW resonators 61, 62 adjusted to be within the second attenuation band are different from each other. The reason that the resonance frequencies of the two SAW resonators 51, 52 (or 61, 62) for attenuating a signal level (electric power level) in the same attenuation band are made different from each other is to secure an attenuation band region in the required attenuation band even if it is narrow. It should be noted that as long as the attenuation band can be secured, the resonance frequencies of the SAW resonators 51, 52 can be the same and the resonance is frequencies of the SAW resonators 61, 62 can be the same.

Figure 11:
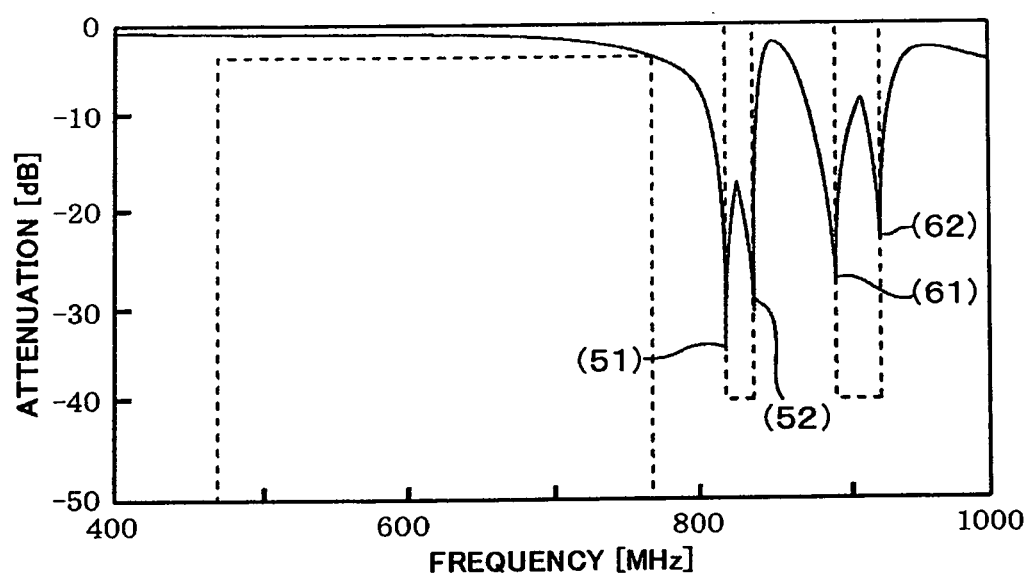
FIG. 11 is a characteristic chart showing a transmission characteristic of the SAW filter shown in FIG. 10.

The SAW resonator used in this embodiment is equivalent to an element part generating series resonance. Further, the SAW resonators 51, 52 and the SAW resonators 61, 62 are each equivalent to a "set of resonators" and equivalent to a "set of element parts" when made correspond to a term in claims. As stated above, by connecting the "sets of resonators" in two stages a transmission characteristic shown in FIG. 11 can be obtained. A numeral in a bracket in FIG. 11 indicates the SAW resonator having contributed to attenuation.

As can be known from this transmission characteristic, in the circuit of FIG. 10 a larger attenuation amount can be secured in the attenuation band compared with the transmission characteristic (see FIG. 5) in a case of one set shown in FIG. 4. It should be noted that the inductor 81 is provided between the respective stages (between SAW resonators 51, 52 and SAW resonators 61, 62) in the signal path, and that if the inductor 81 is not provided a zero point is formed between the respective poles formed by the SAW resonators 51, 52 (or 61, 62). Therefore, the inductor 81 fulfills a role of inverting a phase, and further fulfills also a role of attenuating a signal level in a higher band side than the second attenuation band.

Figure 12:
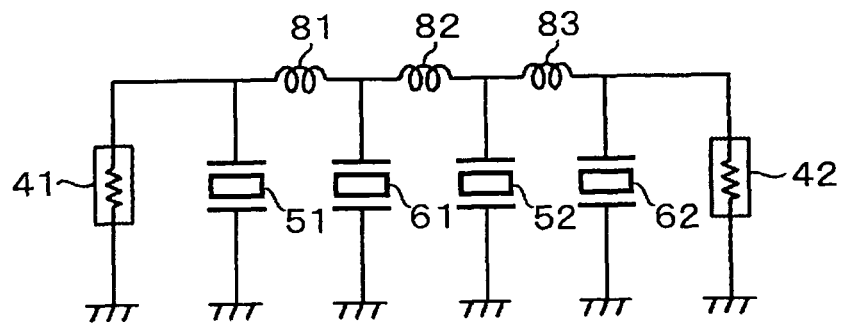
FIG. 12 is a circuit diagram showing a conventional SAW filter for comparison with the SAW filter being the above-described embodiment of the present invention.
Figure 13:
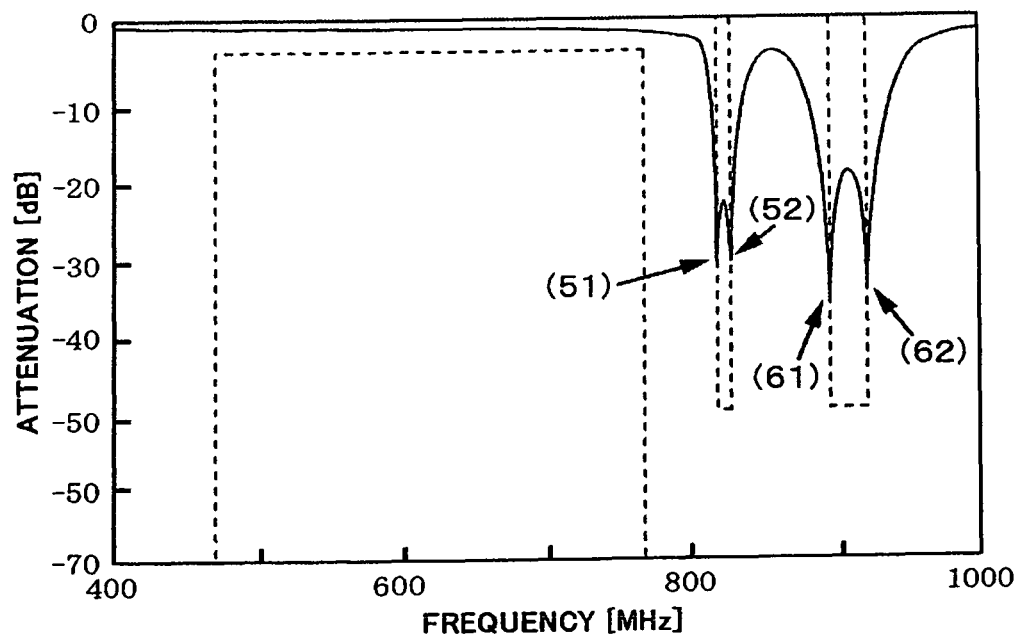
FIG. 13 is a characteristic chart showing a transmission characteristic of the SAW filter shown in FIG. 12.

Here, in FIG. 12 there is shown an SAW filter whose circuit is constituted by a conventional method (method in Patent Document 1) by using SAW resonators 51, 52 and SAW resonators 61, 62. In this circuit, the respective SAW resonators 51, 52 and SAW resonators 61, 62 are connected is via the inductors 81, 82, and 83. FIG. 13 shows a transmission characteristic in the circuit of FIG. 12, which is equivalent to the transmission characteristic of FIG. 11. This indicates that according to the circuit of FIG. 10 being an embodiment of the SAW filter of the present invention, the number of inductors can be reduced while obtaining a transmission characteristic equal to that of a conventional circuit.

Figure 14:
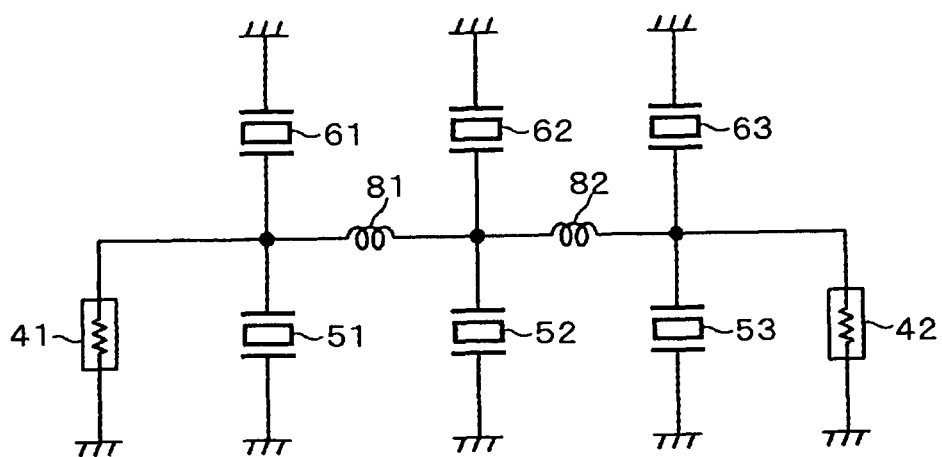
FIG. 14 is a circuit diagram showing an SAW filter being another embodiment of the present invention.
Figure 15:
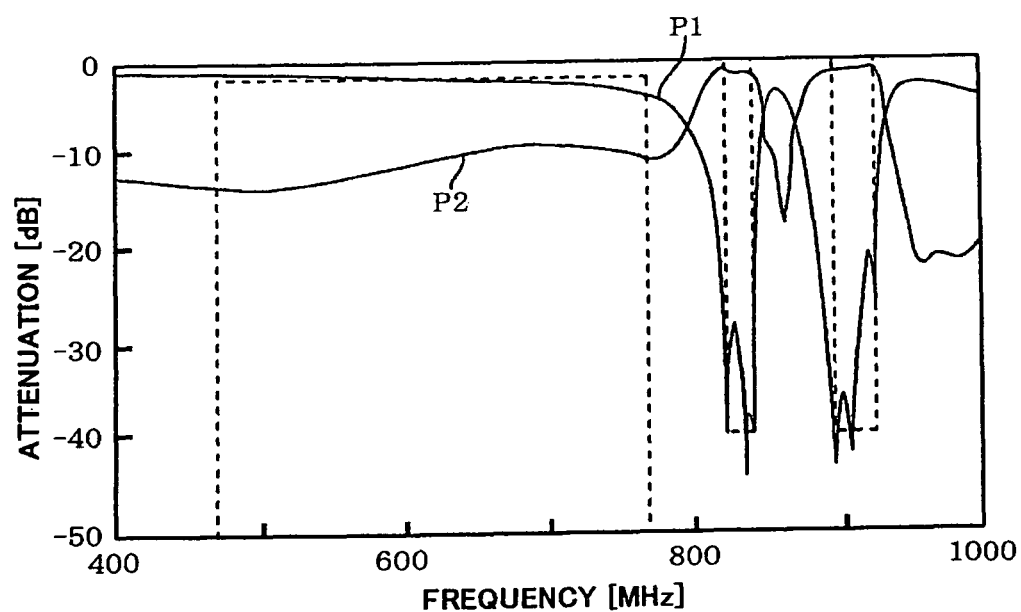
FIG. 15 is a characteristic chart showing a transmission characteristic of the SAW filter shown in FIG. 14.

FIG. 14 shows a circuit according to another embodiment of the present invention, where sets of two SAW resonators connected to the same electric potential point in a signal path are connected in three stages via inductors 81, 82. Resonance frequencies of the SAW resonators 51, 52, 53 are set to be frequencies corresponding to the first attenuation band and frequencies different from each other, while resonance frequencies of the SAW resonators 61, 62, 63 are set to be frequencies corresponding to the second attenuation band and frequencies different from each other. FIG. 15 shows a transmission characteristic of a circuit of FIG. 14 and it can be known that in the respective first attenuation band and second attenuation band, three poles are formed in correspondence with the three SAW resonators 51, 52, 53 (61, 62, 63).

Figure 16:
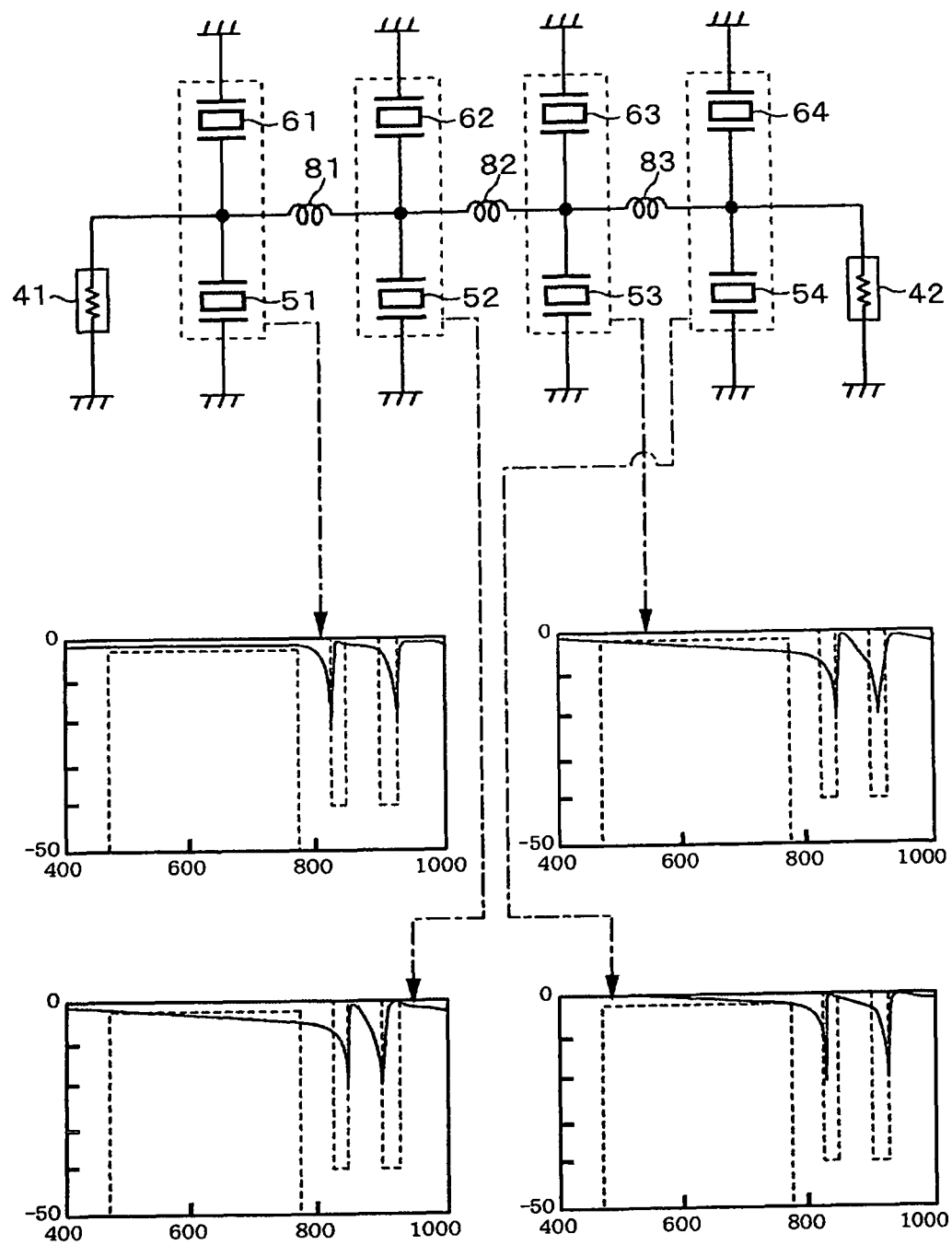
FIG. 16 is a circuit diagram showing an SAW filter being still another embodiment of the present invention.

FIG. 16 shows a circuit according to still another embodiment of the present invention, where sets of two SAW resonators connected to the same electric potential point in a signal path are connected in four stages via inductors 81, 82, 83. In FIG. 16, transmission characteristics in a case that only each set of SAW resonators is used are shown, correspondingly to each set. Resonance frequencies of the SAW resonators 51, 52, 53, 54 are set to be frequencies corresponding to the first attenuation band and frequencies different from each other, while resonance frequencies of the SAW resonators 61, 62, 63, 64 are set to be frequencies corresponding to the second attenuation band and frequencies different from each other.

Figure 17:
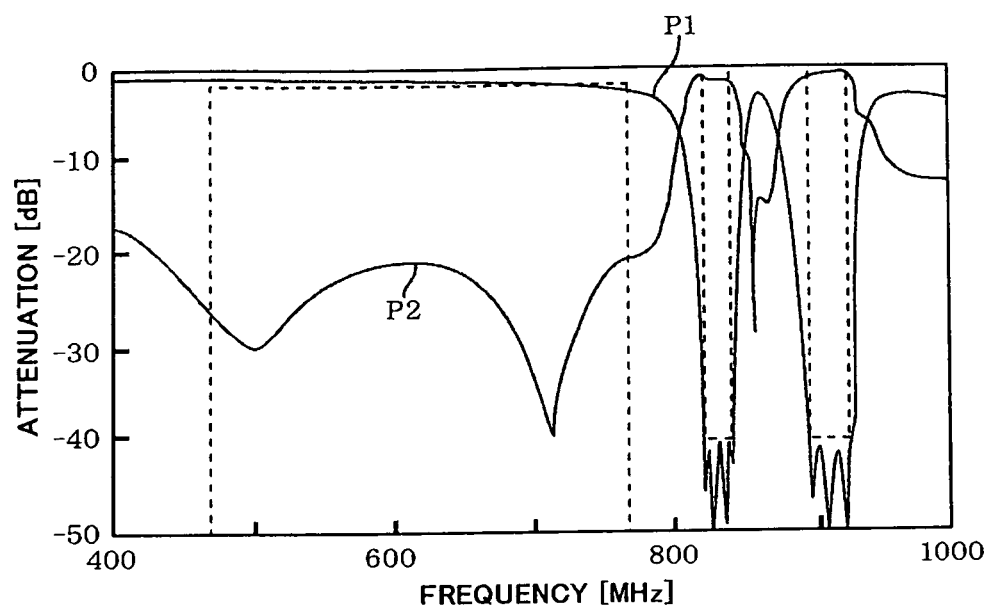
FIG. 17 is a characteristic chart showing a transmission characteristic of the SAW filter shown in FIG. 16.

FIG. 17 shows a transmission characteristic of the circuit of FIG. 16, and in the respective first attenuation band and second attenuation band, four poles are formed in correspondence with the four SAW resonators 51, 52, 53, 54 (61, 62, 63, 64). As is understood by comparing FIG. 11, FIG. 15 and FIG. 17, by increasing the connection number of sets of two SAW resonators, an attenuation amount in each of the first attenuation band and second attenuation band can be increased.

Figure 18:
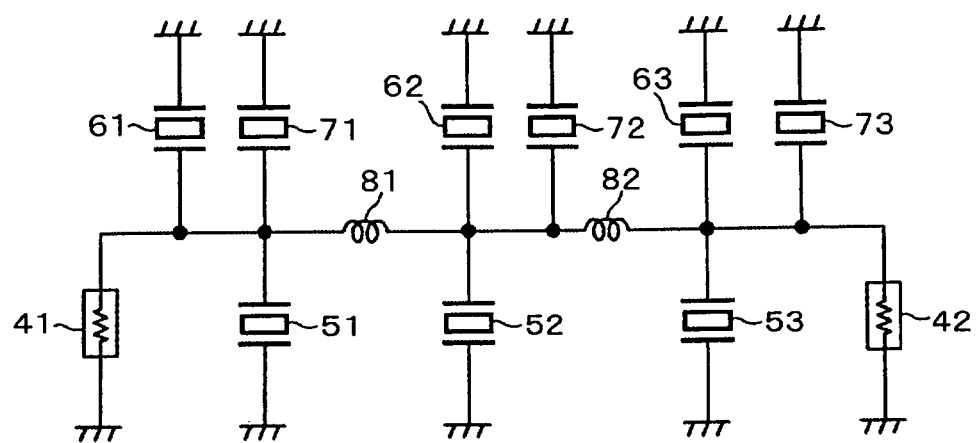
FIG. 18 is a circuit diagram showing an SAW filter being yet another embodiment of the present invention.
Figure 19:
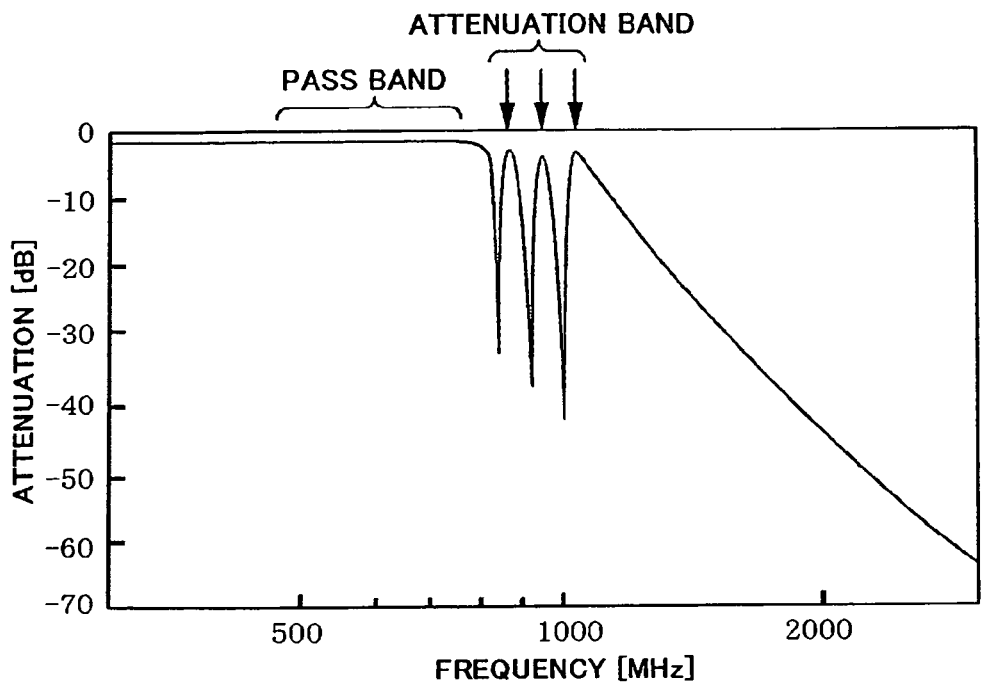
FIG. 19 is a characteristic chart showing a transmission characteristic of the SAW filter shown in FIG. 18.
Figure 20:
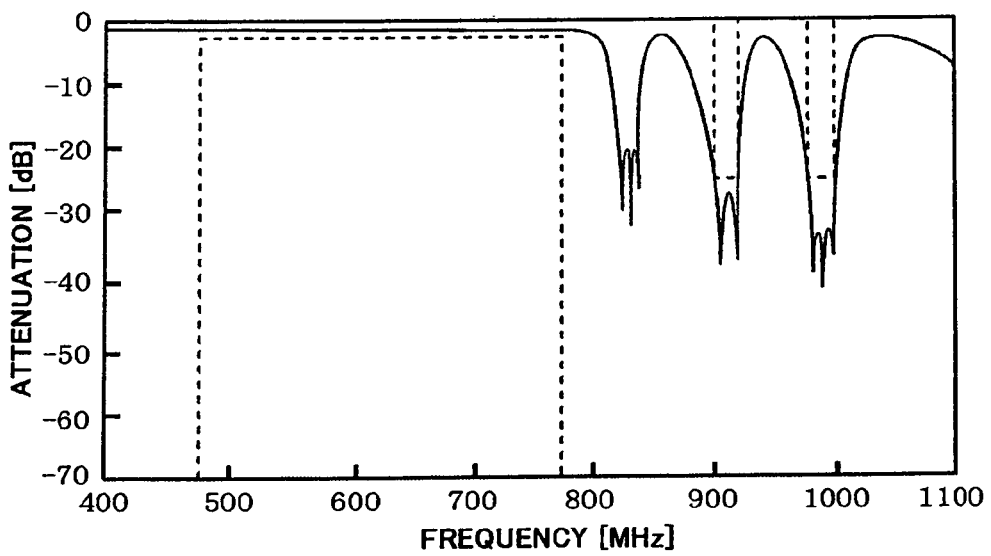
FIG. 20 is a characteristic chart enlargedly showing the transmission characteristic of the SAW filter shown in FIG. 19.

FIG. 18 shows a circuit according to yet another embodiment of the present invention. This circuit is intended to attenuate signal levels steeply in three attenuation bands and to secure large attenuation amounts. In this circuit, sets of three SAW resonators connected to the same electric potential point in a signal path are connected in three stages via inductors 81, 82. When these three attenuation bands are called a first attenuation band, a second attenuation band and a third attenuation band, resonance frequencies of the SAW resonators 51, 52, 53 are set to be frequencies corresponding to the first attenuation band and frequencies different from each other, resonance frequencies of the SAW resonators 61, 62, 63 are set to be frequencies corresponding to the second attenuation band and frequencies different from each other, and resonance frequencies of the SAW resonators 71, 72, 73 are set to be frequencies corresponding to the third attenuation band and frequencies different from each other. FIG. 19 and FIG. 20 show a transmission characteristic of the circuit of FIG. 18, and it can be known that in each of the first attenuation band, the second attenuation band and the third attenuation band three poles are formed in correspondence with three SAW resonators 51, 52, 53 (61, 62, 63) (71, 72, 73).

Second Embodiment

Figure 21:
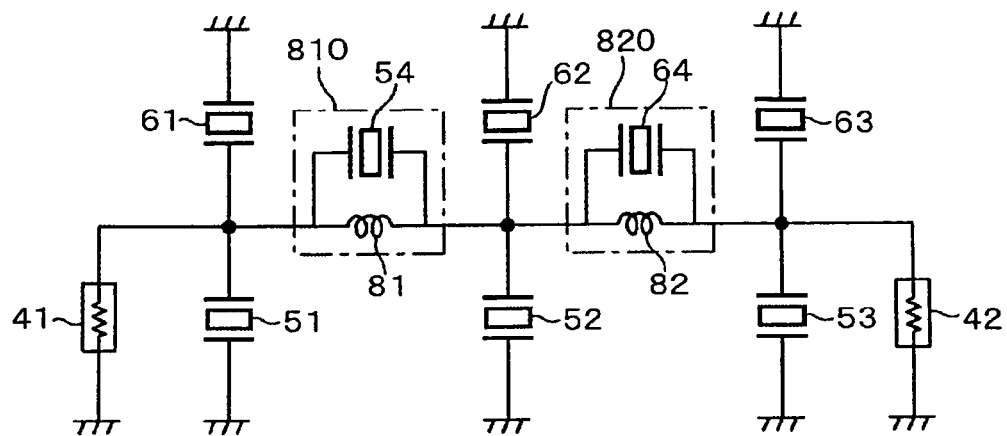
FIG. 21 is a circuit diagram showing an SAW filter being yet another embodiment of the present invention.

Further, in the present invention, in a case that a signal level is to be attenuated in a first attenuation band and a second attenuation band, a constitution shown in FIG. 21 can be adopted. In this circuit sets of SAW resonators shown in FIG. 14 described above are connected in three stages, and in addition, another set of SAW resonators is prepared and one and the other of two SAW resonators 54, 64 constituting the set are connected in parallel to inductors 81, 82 respectively. Then, those parallel circuits 810 and 820 are constituted to resonate in parallel in the first attenuation band and the second attenuation band respectively. It should be noted that in the parallel circuits 810 and 820 resonance frequencies can slightly depart from the first attenuation band and the second attenuation band respectively as long as obtained transmission characteristics are satisfying.

Figure 22:
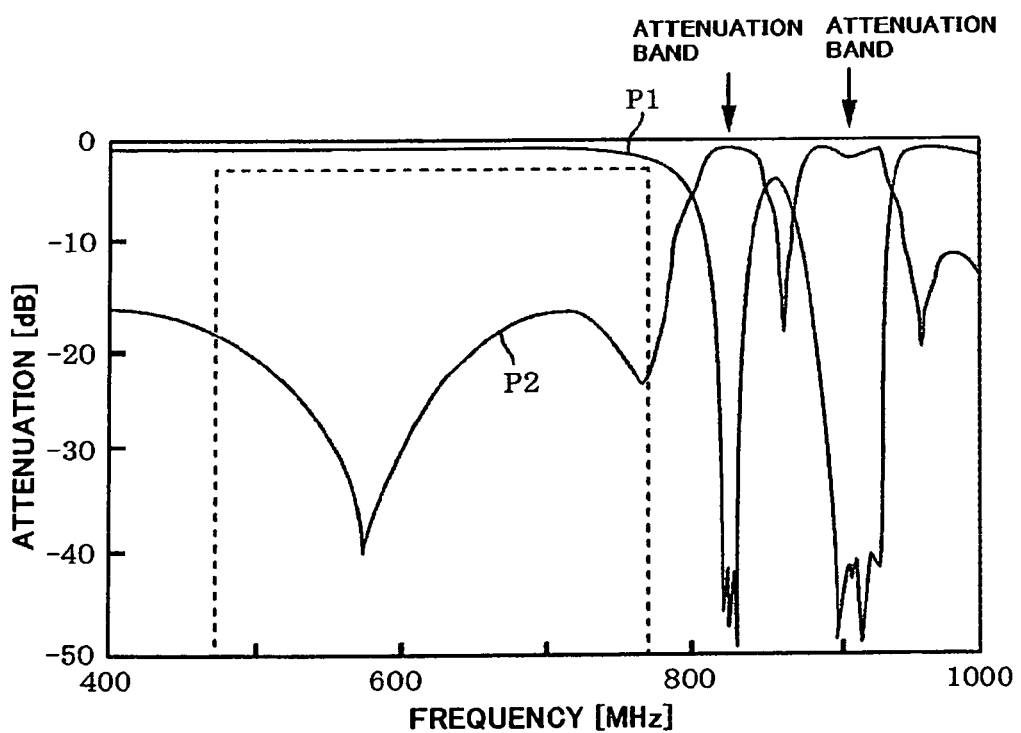
FIG. 22 is a characteristic chart showing a transmission characteristic of the SAW filter shown in FIG. 21.

In other words, the circuit shown in FIG. 21 is to secure an attenuation amount by resonating the SAW resonators being parallel arms in series and additionally to secure an attenuation amount by using parallel resonance of the parallel circuits 810 and 820. FIG. 22 shows a transmission characteristic of the circuit of FIG. 21, and though sets of the SAW resonators are connected in three stages an attenuation amount around −50 dB can be obtained similarly in the transmission characteristic (FIG. 17) in a case that the sets of the SAW resonators are connected in four stages. Therefore, adoption of such a circuit enables further reduction of the number of inductors. When such a circuit is to be constituted, the number of connection stages of the SAW resonators are required to be larger than the number of the attenuation bands by one or more, and in an example of FIG. 21, the number of connection stages of the sets of the SAW resonators is three stages and the number of the attenuation bands is two.

Third Embodiment

In the first embodiment, it is constituted that the sets of the plural SAW resonators, of two resonators for example, which are connected to the same electric potential point in the signal path, are connected in the plural stages, in two stages for example, via the inductor. In contrast, in a third embodiment, a series circuit in which a plurality of SAW resonators are connected to each other in series is constituted as a parallel arm, and sets of SAW resonators being the parallel arms are connected in a plurality of stages via an inductor.

Figure 23:
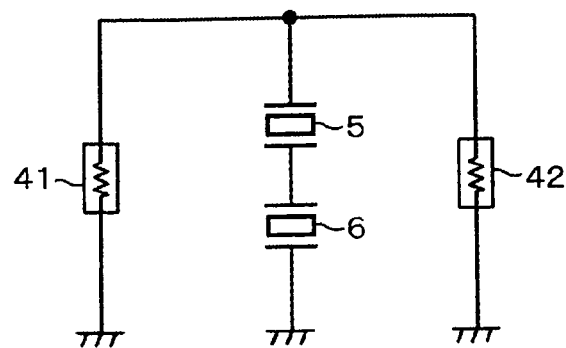
FIG. 23 is a circuit diagram showing an example of an SAW filter constituted by connecting a series circuit of two SAW resonators as a parallel arm.
Figure 24:
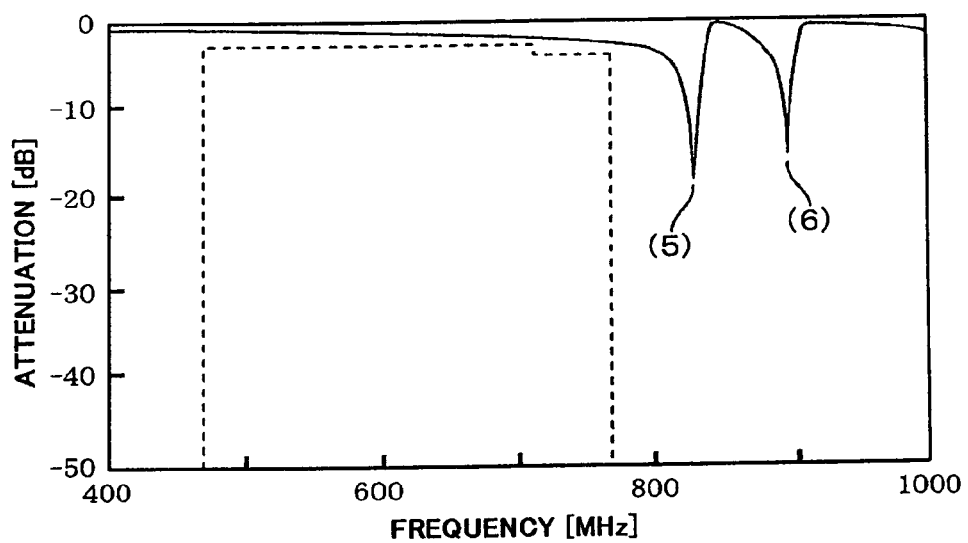
FIG. 24 is a characteristic chart showing a transmission characteristic of the SAW filter of FIG. 23.

FIG. 23 shows an SAW filter constituted by connecting two SAW resonators 5, 6 to the same electric potential point in a signal path as a parallel arm, to the SAW filter resonance points different from each other being set so that steep attenuation amounts can be obtained in respective two attenuation bands close to each other. FIG. 24 shows a transmission characteristic in the SAW filter of FIG. 23, and it can be known that poles exist in pass characteristics in the respective aimed two attenuation bands and that a zero point of a reflection characteristic exists between two poles. A reference numeral written in a bracket in FIG. 24 indicates the pole corresponding to a resonance frequency of the SAW resonator having the same reference numeral. Therefore, it can be also known that also in this transmission characteristic a region of quite low loss exists between two attenuation bands. Comparing FIG. 23 with FIG. 4, there is a difference in that in FIG. 4 the SAW resonator 5 and the SAW resonator 6 are each connected to the same electric potential point in the signal path as parallel arms while in FIG. 23 the series circuits of SAW resonators 5, 6 are connected as a parallel arm.

Figure 25:
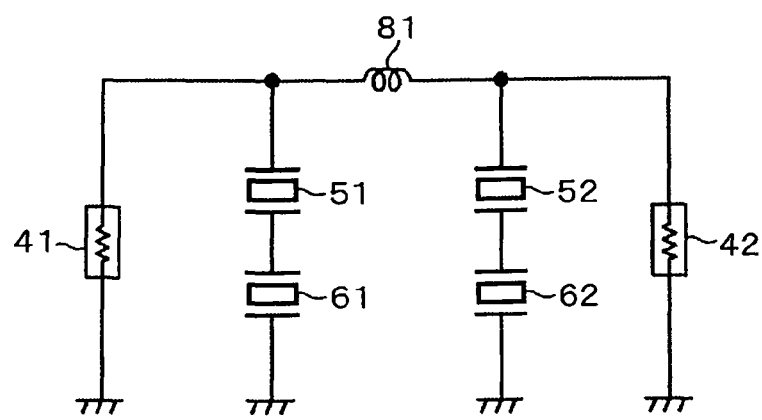
FIG. 25 is a circuit diagram showing an SAW filter being an embodiment of the present invention.
Figure 26:
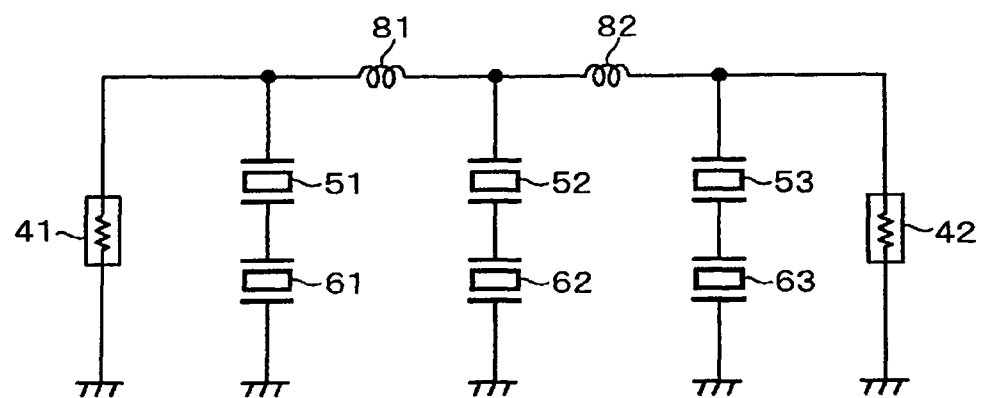
FIG. 26 is a circuit diagram showing an SAW filter being an embodiment of the present invention.
Figure 27:
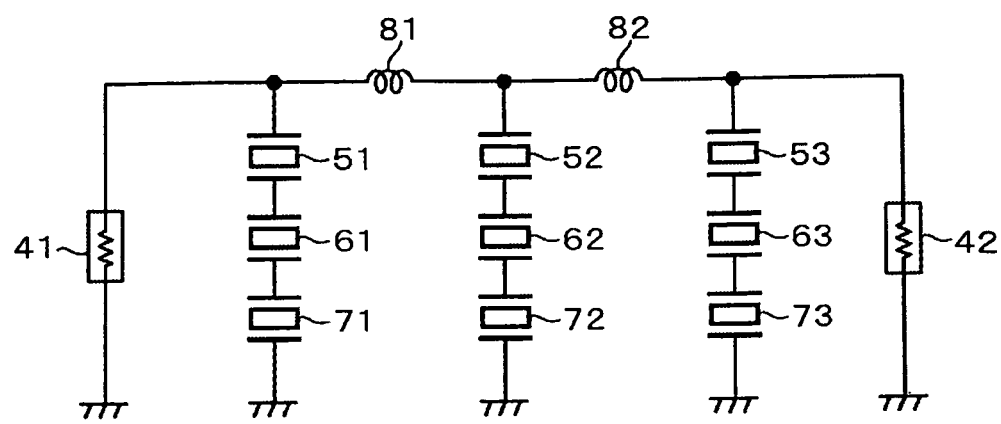
FIG. 27 is a circuit diagram showing an SAW filter being an embodiment of the present invention.
Figure 28:
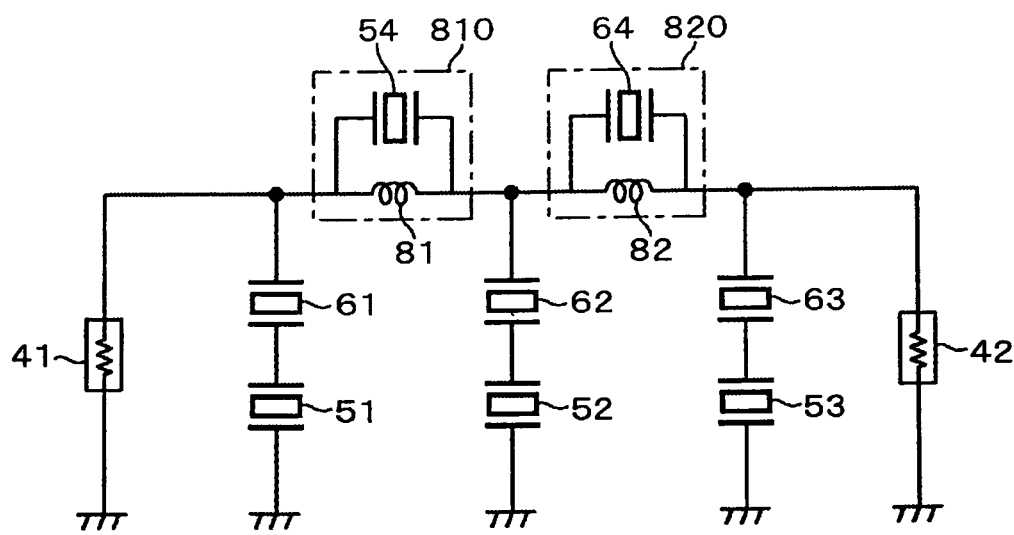
FIG. 28 is a circuit diagram showing an SAW filter being an embodiment of the present invention.

FIG. 25 is equivalent to an example of FIG. 10 of the first embodiment, and parallel arms constituted by two SAW resonators connected to each other in series are connected in two stages via an inductor 81. In FIG. 25, both of SAW resonators 51, 52 are for securing a large attenuation amount in a first attenuation band (attenuation band of 824 to 830 MHz), while both of SAW resonators 61, 62 are for securing a large attenuation amount in a second attenuation band (attenuation band of 898 to 925 MHz).

Figure 29:
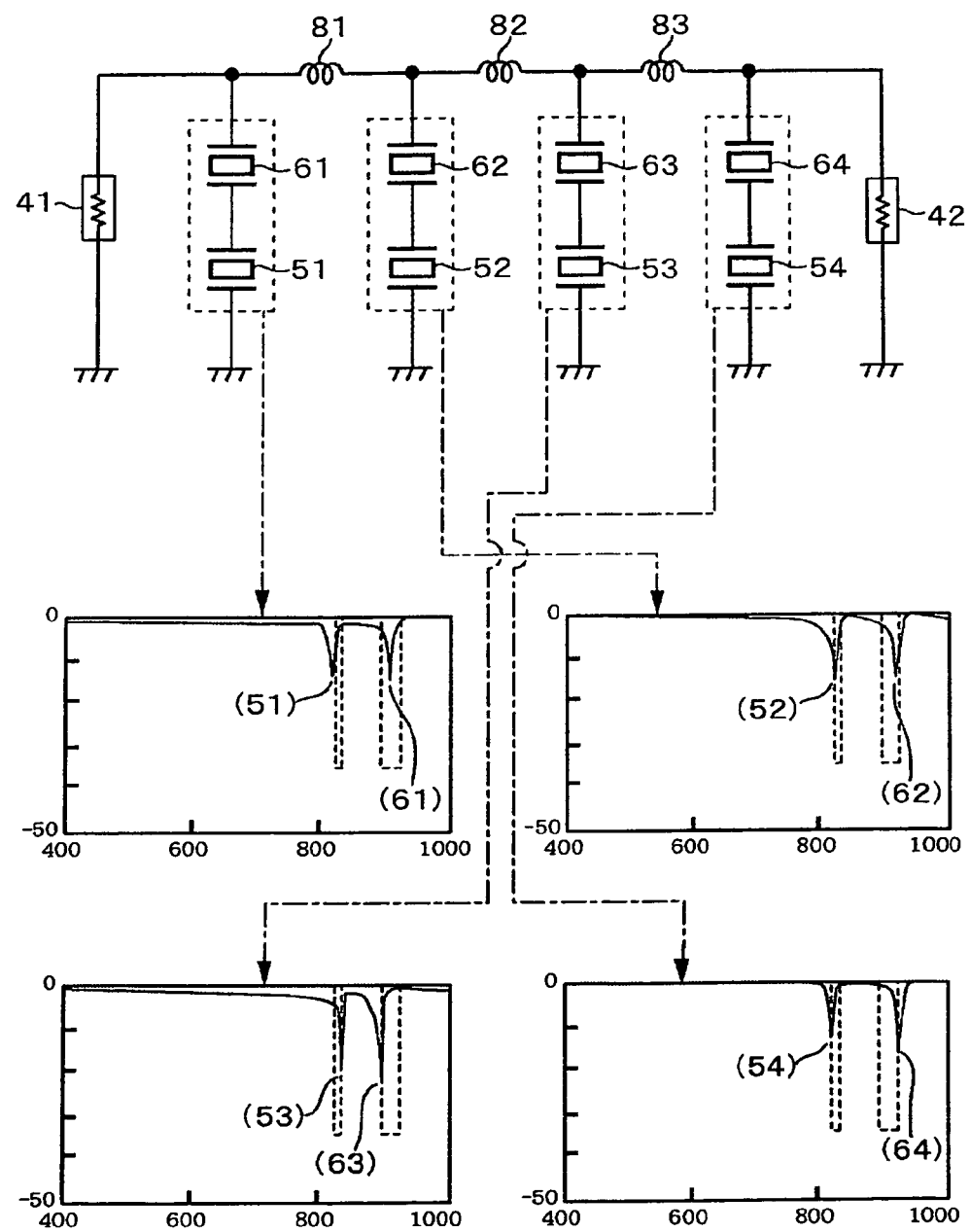
FIG. 29 is a circuit diagram showing an SAW filter being another embodiment of the present invention.

Also in the third embodiment, the parallel arms can be connected in three or more stages and the number of SAW resonators constituting each parallel arm can be three or more thereby to secure attenuation amounts in three attenuation bands respectively by those three SAW resonators. Further, also in the third embodiment, a similar constitution to a constitution adopted in FIG. 21 can be adopted. The respective constitutions of FIG. 26, FIG. 27, FIG. 28 and FIG. 29 each correspond to the respective constitutions of FIG. 14, FIG. 18, FIG. 21 and FIG. 16 in the first embodiment. In FIG. 29, transmission characteristics in a case that only sets of the respective SAW resonators (respective parallel arms) are used are shown correspondingly to the respective sets.

Figure 30:
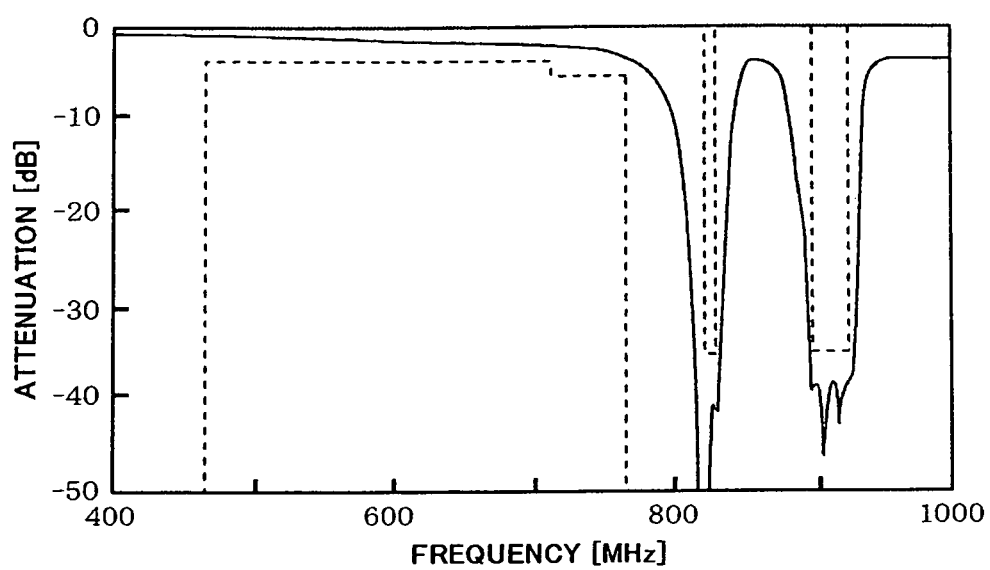
FIG. 30 is a characteristic chart showing a transmission characteristic of the SAW filter shown in FIG. 29.

FIG. 30 shows a transmission characteristic of a circuit of FIG. 29, and it can be known that similarly in a case of an example (see FIG. 17) of four-stage connection in the first embodiment four poles are formed in correspondence with four SAW resonators 51, 52, 53, 54 (61, 62, 63, 64) in each of a first attenuation band and a second attenuation band. As stated above, also in the third embodiment, a similar effect can be obtained as in the first embodiment.

As stated above, according to the embodiments of the present invention, while reducing the number of inductors it is possible to obtain an aimed transmission characteristic, that is, a transmission characteristic capable of securing steep and large attenuation amounts in a plurality of attenuation bands set in a higher band side of a pass characteristic. It should be noted that the plural attenuation bands can exist in a lower band side of the pass band. As stated above, it is advantageous that the inductor is constituted by the coil being the external component, but then a size of the component becomes large. Thus, the fact that the number of the inductors can be reduced can contribute to miniaturization of the device, and this is quite preferable as an elastic wave filter to be incorporated in a portable terminal for example.

In the above, the elastic wave resonator is not limited to a resonator (SAW resonator) using a surface acoustic wave, but can be a resonator disclosed recently which uses an elastic wave propagated inside a piezoelectric substrate rather than on a surface thereof.

Further, as an element part generating series resonance being a component of the filter of the present invention is not limited to the SAW resonator, but can be a crystal resonator, a piezoelectric thin film resonator, an MEMS resonator, or a dielectric. As the piezoelectric thin film resonator, an FBAR (Film Bulk Acoustic Resonator) or an SMR (Solid Mounted Resonator) for example can be cited. In a case that the dielectric is used as the element part, it is constituted that the dielectrics are provided in both sides of a microstrip line. Further, as the above-described element part, a resonance circuit (LC resonance circuit) constituted by a coil and a capacitor is also included. Also in this case, since the number of inductors for phase inversion can be reduced compared with a case of constituting a conventional filter by using an LC resonance circuit, there is an effect that the number of components can be reduced.

Figure 31:
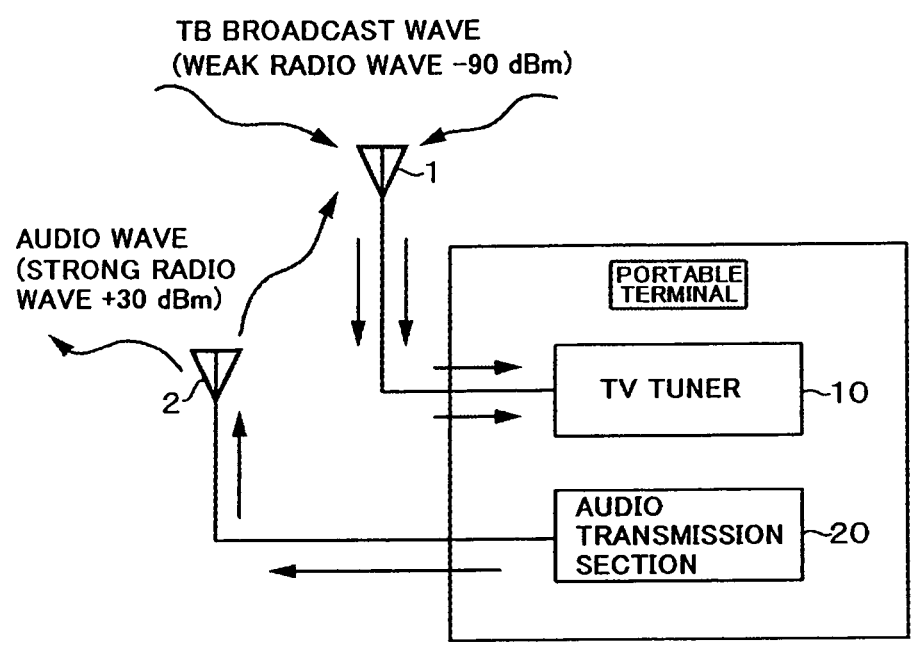
FIG. 31 is a constitution diagram showing a transmission/reception section of a portable terminal having a digital terrestrial TV receiver.

Further, a portable terminal is shown in FIG. 31 explained in the background art, and a portable terminal of the present invention is one made by applying a surface acoustic wave filter of the above-described embodiment for example to a TV tuner of the portable terminal of FIG. 31. Further, as an electronic component of the present invention, there can be cited a digital terrestrial TV tuner module to which the surface acoustic wave filter of the above-described embodiment is applied to an SAWBEF for example.

The invention claimed is:

1. A filter for forming a plurality of attenuation bands which are determined based on each one of a plurality of transmission bands assigned to communication common carriers in a higher band side or a lower band side than a pass band, the filter comprising:
   element parts generating series resonance at frequencies each corresponding to the plurality of attenuation bands, said element parts forming sets of element parts, comprising sets constituted by a plurality of said element parts connected to the same electric potential point in a signal path so as to provide a plurality of parallel arms themselves, in order to form the respective plurality of attenuation bands;
   said sets of element parts constituted by a plurality of said element parts connected to the signal path in a plurality of stages; and
   an inductor for phase inversion provided in the signal path between said sets of element parts adjacent to each other.

2. An electronic component, comprising the filter according to claim 1.

3. The filter according to claim 1, wherein the element parts are first element parts, the filter further comprising second element parts each generating series resonance connected in parallel to said inductors of the number equivalent to the number of the attenuation bands among said inductors connected between the respective stages, thereby constituting a plurality of parallel circuits,
   wherein the number of connection stages of said sets of first element parts is larger than the number of the attenuation bands by one or more,
   and
   wherein parallel resonance frequencies of the plurality of parallel circuits are set to be frequencies each corresponding to the plurality of attenuation bands.

4. The filter according to claim 1, wherein each of said element parts generating series resonance is selected from an elastic wave resonator, a surface acoustic wave resonator, a crystal resonator, a piezoelectric thin film resonator, an MEMS resonator, a dielectric, and a resonance circuit constituted by a coil and a capacitor.

5. The filter according to claim 1, wherein the pass band is a reception band of digital terrestrial TV broadcast, and the attenuation band is a transmission band of audio and/or data as a portable terminal.

6. A portable terminal comprising:
   an antenna and a reception section for receiving a radio wave for digital terrestrial TV broadcast and an antenna for transmitting/receiving audio and/or data as the portable terminal,
   wherein the filter according to claim 1 is provided in the reception section.

7. A filter for forming a plurality of attenuation bands in a higher band side or a lower band side than a pass band, the filter comprising:
   first element parts generating series resonance at frequencies each corresponding to the plurality of attenuation bands, said first element parts forming sets of first element parts, comprising sets constituted by a plurality of said first element parts connected to the same electric potential point in a signal path so as to provide a plurality of parallel arms themselves, in order to form the respective plurality of attenuation bands;
   said sets of first element parts constituted by a plurality of said first element parts connected to the signal path in a plurality of stages;
   an inductor for phase inversion provided in the signal path between said sets of first element parts adjacent to each other; and
   second element parts each generating series resonance connected in parallel to said inductors of the number equivalent to the number of the attenuation bands among said inductors connected between the respective stages, thereby constituting a plurality of parallel circuits,
   wherein the number of connection stages of said sets of first element parts is larger than the number of the attenuation bands by one or more, and
wherein parallel resonance frequencies of the plurality of parallel circuits are set to be frequencies each corresponding to the plurality of attenuation bands.

8. A filter for forming a plurality of attenuation bands in a higher band side or a lower band side than a pass band, the filter comprising:

first element parts generating series resonance at frequencies each corresponding to the plurality of attenuation bands, said first element parts comprising a plurality of element parts connected to each other in series so as to form a series circuit connected to a signal path as a parallel arm, in order to form the respective plurality of attenuation bands;

sets of element parts being the series circuit constituted by said plurality of first element parts, said sets of first element parts connected to the signal path in a plurality of stages;

an inductor for phase inversion provided in the signal path between said sets of element parts adjacent to each other; and second element parts each generating series resonance connected in parallel to said inductors of the number equivalent to the number of the attenuation bands among said inductors connected between the respective stages, thereby constituting a plurality of parallel circuits;

wherein the number of connection stages of said sets of element parts is larger than the number of the attenuation bands by one or more, and wherein parallel resonance frequencies of the plurality of parallel circuits are set to be frequencies each corresponding to the plurality of attenuation bands.

9. The filter according to claim 8, wherein each of said element part generating series resonance is selected from an elastic wave resonator, a surface acoustic wave resonator, a crystal resonator, a piezoelectric thin film resonator, an MEMS resonator, a dielectric, and a resonance circuit constituted by a coil and a capacitor.

10. The filter according to claim 8, wherein the pass band is a reception band of digital terrestrial TV broadcast, and the attenuation band is a transmission band of audio and/or data as a portable terminal.

11. A portable terminal comprising:

an antenna and a reception section for receiving a radio wave for digital terrestrial TV broadcast and an antenna for transmitting/receiving audio and/or data as the portable terminal, wherein the filter according to claim 8 is provided in the reception section.

12. An electronic component, comprising the filter according to claim 8.

* * * * *